US011189587B2

(12) United States Patent
Lu

(10) Patent No.: US 11,189,587 B2
(45) Date of Patent: Nov. 30, 2021

(54) SEMICONDUCTOR DEVICE PACKAGE WITH ORGANIC REINFORCEMENT STRUCTURE

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 43 days.

(21) Appl. No.: 16/673,708

(22) Filed: Nov. 4, 2019

(65) Prior Publication Data

US 2021/0134752 A1 May 6, 2021

(51) Int. Cl.
*H01L 23/538* (2006.01)
*H01L 23/00* (2006.01)
(Continued)

(52) U.S. Cl.
CPC .......... *H01L 24/20* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 25/105* (2013.01); *H01L 2221/68372* (2013.01); *H01L 2224/214* (2013.01); *H01L 2225/1035* (2013.01); *H01L 2225/1047* (2013.01)

(58) Field of Classification Search
CPC ....... H01L 24/19; H01L 24/20; H01L 21/565; H01L 21/76832; H01L 21/76834; H01L 21/76835; H01L 25/50; H01L 25/04; H01L 25/065; H01L 25/0652; H01L 25/0655; H01L 25/0657; H01L 25/165
See application file for complete search history.

(56) References Cited

U.S. PATENT DOCUMENTS

| 2003/0227095 A1* | 12/2003 | Fujisawa | H01L 23/3128 257/782 |
| 2017/0154838 A1* | 6/2017 | Kim | H01L 23/485 |
| 2019/0148351 A1* | 5/2019 | Chen | H01L 24/09 257/678 |

* cited by examiner

*Primary Examiner* — Stephen M Bradley
*Assistant Examiner* — Gustavo G Ramallo
(74) *Attorney, Agent, or Firm* — Foley & Lardner LLP

(57) ABSTRACT

A semiconductor device package includes an electronic component. The electronic component has an active surface, a back surface opposite to the active surface, and a lateral surface connected between the active surface and the back surface. The electronic component has an electrical contact disposed on the active surface. The semiconductor device package also includes a redistribution layer (RDL) contacting the back surface of the electronic component, a first dielectric layer surrounding the electrical contact on the active surface of the electronic component, and a second dielectric layer surrounding the lateral surface of the electronic component and the first dielectric layer. The second dielectric layer has a first sidewall in contact with the lateral surface of the electronic component and a second sidewall opposite to the first sidewall. The second sidewall of the second dielectric layer has a first portion proximal to the RDL and a second portion distal from the RDL. The first portion and the second portion define a stepped feature on the second sidewall. A method of manufacturing a semiconductor device package is also disclosed.

10 Claims, 18 Drawing Sheets

(51) Int. Cl.
*H01L 21/683* (2006.01)
*H01L 21/48* (2006.01)
*H01L 21/56* (2006.01)
*H01L 25/10* (2006.01)
*H01L 23/31* (2006.01)

SEMICONDUCTOR DEVICE PACKAGE WITH ORGANIC REINFORCEMENT STRUCTURE

BACKGROUND

1. Technical Field

The present disclosure generally relates to a semiconductor device package and a method of manufacturing the same, and to a semiconductor device package having a dielectric layer with a stepped feature and a method of manufacturing the same.

2. Description of the Related Art

A semiconductor device package can have one or more chips attached or bonded to a substrate through the connection of conductive bumps and dielectric surfaces, or a so-called hybrid-bonding structure. Adjacent chips in the hybrid-bonding structure may be separated and/or isolated by an isolating structure spacing the adjacent chips. The isolating structure may serve the purpose of a reinforcement element to the semiconductor device package.

SUMMARY

In one or more embodiments, a semiconductor device package includes an electronic component. The electronic component has an active surface, a back surface opposite to the active surface, and a lateral surface connected between the active surface and the back surface. The electronic component has an electrical contact disposed on the active surface. The semiconductor device package also includes a redistribution layer (RDL) contacting the back surface of the electronic component, a first dielectric layer surrounding the electrical contact on the active surface of the electronic component, and a second dielectric layer surrounding the lateral surface of the electronic component and the first dielectric layer. The second dielectric layer has a first sidewall in contact with the lateral surface of the electronic component and a second sidewall opposite to the first sidewall. The second sidewall of the second dielectric layer has a first portion proximal to the RDL and a second portion distal from the RDL. The first portion and the second portion define a stepped feature on the second sidewall.

In one or more embodiments, a semiconductor device package includes an electronic component. The electronic component has an active surface, a back surface opposite to the active surface, and a lateral surface connected between the active surface and the back surface. The electronic component has an electrical contact disposed on the active surface. The semiconductor device package also includes a first dielectric layer surrounding the lateral surface of the electronic component. The first dielectric layer has a first surface substantially coplanar with the back surface of the electronic component. The semiconductor device package also includes an insulating structure disposed adjacent to the electronic component and in contact with the first dielectric layer. The semiconductor device package also includes a second dielectric layer in contact with the back surface of the electronic component and the insulating structure. The second dielectric layer and the insulating structure form an interface under the first surface of the first dielectric layer.

In one or more embodiments, a method of manufacturing a semiconductor device package includes providing an electronic component on a carrier. The electronic component has an active surface, a back surface opposite to the active surface, and a lateral surface connected between the active surface and the back surface. The electronic component has an electrical contact disposed on the active surface. The method also includes providing a first dielectric layer surrounding the electrical contact on the active surface of the electronic component. The method also includes providing a second dielectric layer surrounding the lateral surface of the electronic component and the first dielectric layer. A portion of the second dielectric layer is disposed on the carrier. The method also includes partially removing the second dielectric layer to expose a portion of the carrier.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
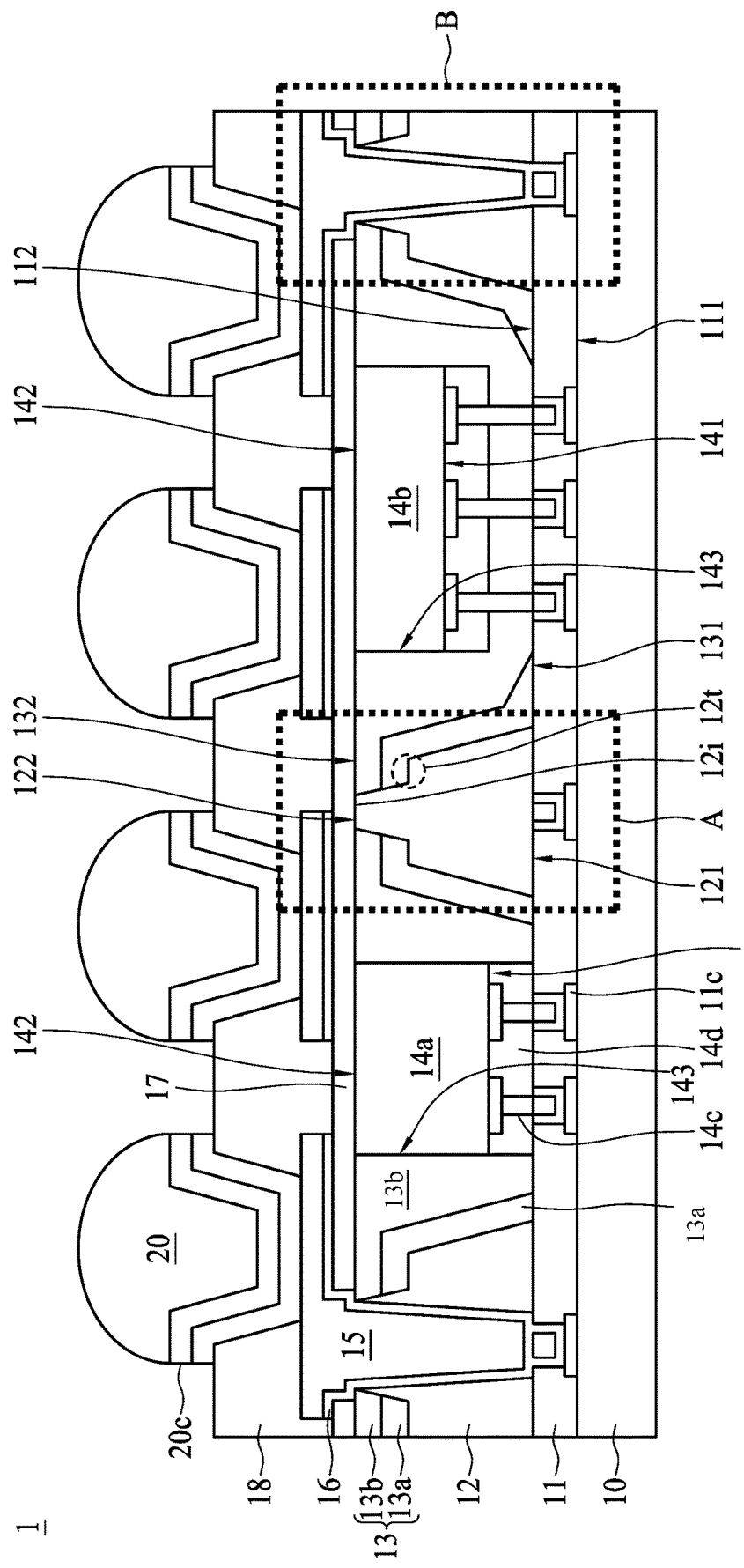
FIG. 1 illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

In the manufacturing of a hybrid-bonding structure, two types of operations may be adopted. Type one includes forming an isolating structure or a reinforcement structure to isolate adjacent chips, and then exposing a hybrid surface on the chip by grinding from an active side of the chip and the isolating structure. Type two includes exposing a hybrid surface on a chip by grinding from an active side of the chip, and then forming an isolating structure or a reinforcement structure to isolate adjacent chips.

In type one, the isolating structure or the reinforcement structure usually includes an organic material, and the dielectric portion of the hybrid surface on the chip usually includes an inorganic material (e.g., oxides or nitrides). Therefore, when the hybrid surface on the chip is exposed by, for example, a thinning operation (e.g., using a grinding wheel), micro cracks may be introduced between the isolating structure and the dielectric portion of the hybrid surface due to the drag force exerted on the organic/inorganic heterogeneous interface.

In type two, the micro cracks in the type one may be avoided since the organic material of the isolating structure is disposed after the thinning operation is completed. Adjacent chips are disposed over a reconstitution substrate, inorganic materials are conformally formed over the adjacent chips by a suitable physical vapor deposition (PVD) operation. Because of a feature of PVD operation, the inorganic materials create a handstand trapezoid space between adjacent dies. As the demand for input/output (I/O) quantity arises, shrinkage in both pitch and dimension of the I/O are specified, and so do spaces between adjacent chips. It becomes more difficult to fill the handstand trapezoid spaces with a narrower top and wider bottom between adjacent chips with an organic material without introducing voids in the spaces. The voids generated may affect the following operations, including but not limited to, drilling operations and electroplating operations.

Present disclosure provides a semiconductor device package having a isolating structure or a reinforcement structure with a stepped feature and a method of manufacturing the same. The semiconductor device package and the manufacturing method disclosed herein can mitigate the micro crack formation between organic/inorganic heterogeneous interface as well as the voids generated in the space between adjacent chips.

FIG. 1 illustrates a cross-sectional view of a semiconductor device package 1 in accordance with some embodiments of the present disclosure.

Referring to FIG. 1, the semiconductor device package 1 may include a substrate 10, a redistribution layer (RDL) 11, an insulating structure 12, dielectric layers 13a and 13b (collectively referred to as the dielectric layer 13), an electronic component 14a, another electronic component 14b, a conductive via 15, a seed layer 16, another RDL 17, a passivation layer 18, and an electrical contact 20.

The substrate 10 may be, or include, a printed circuit board, such as a paper-based copper foil laminate, a composite copper foil laminate, or a polymer-impregnated glass-fiber-based copper foil laminate. The substrate may include an interconnection structure, such as RDL or a grounding element.

The RDL 11 may be disposed on the substrate 10. The RDL 11 may include a surface 111 in contact with the substrate 10 and a hybrid bonding surface 112 opposite to the surface 111. The RDL 11 may include a conductive structure 11c (e.g., a bonding pad, a conductive via, or the like) disposed in a dielectric layer. A top surface of the conductive structure 11c exposing from the dielectric layer surrounding thereto constitutes a hybrid bonding surface 112.

In some embodiments, the dielectric layer of the RDL 11 may include an inorganic material, such as silicon, a glass, a ceramic, a silicon oxide ($SiO_x$), a silicon nitride ($SiN_x$), a tantalum oxide ($TaO_x$) or the like. In some embodiments, the dielectric layer of the RDL 11 may include Borophosphosilicate Glass (BPSG), Undoped Silicate Glass (USG), any combination of two or more thereof, or the like. In some embodiments, the thickness of the dielectric layer may range from about 2 micrometers (μm) to about 10 μm.

The conductive structure 11c may include, for example, gold (Au), silver (Ag), copper (Cu), nickel (Ni), palladium (Pd), another metal, a solder alloy, or a combination of two or more thereof. In some embodiments, the width (or the diameter) of the conductive structure 11c may range from about 2 μm to about 20 μm.

The electronic component 14a may be disposed on the RDL 11. The electronic component 14a may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

The electronic component 14a may have an active surface 141, a back surface 142 (also referred to as backside) opposite to the active surface 141 and a lateral surface 143 extending between (or connected between) the active surface 141 and the back surface 142. The electronic component 14a may be electrically connected to the conductive structure 11c through an electrical contact 14c disposed on the active surface 141 of the electronic component 14a. Such an electrical connection may be obtained by a hybrid-bonding structure. For example, a bonding structure including dielectric-to-dielectric bonding and metal-to-metal bonding.

A dielectric layer 14d may be disposed on the active surface 141 of the electronic component 14a to surround the electrical contact 14c. The dielectric layer 14d may be substantially coplanar with the electrical contact 14c.

The dielectric layer 14d may be disposed between the active surface 141 of the electronic component 14a and the dielectric layer of the RDL 11. The dielectric layer 14d may be disposed under the active surface 141 of the electronic component 14a. The dielectric layer 14d may be disposed above the dielectric layer of the RDL 11.

The dielectric layer 14d may be in contact with the active surface 141 of the electronic component 14a and the dielectric layer of the RDL 11.

In some embodiments, the dielectric layer 14d may include an inorganic material, such as those listed above for the dielectric layer of the RDL 11.

Another RDL 17 may be disposed on the back surface 142 of the electronic component 14a. The RDL 17 may be in contact with the back surface 142 of the electronic component 14a.

The dielectric layer 13 (that is, the dielectric layer 13a and the dielectric layer 13b) may surround the lateral surface 143 of the electronic component 14a. The dielectric layer 13 may surround the dielectric layer 14d disposed on the active surface 141 of the electronic component 14a.

The dielectric layer 13 may have a surface 131 and a surface 132 opposite the surface 131. The surface 131 may be in contact with the RDL 11. The surface 132 may be in contact with the RDL 17.

The surface 132 may be substantially coplanar with the back surface 142 of the electronic component 14a. The surface 132 may be substantially aligned with the back surface 142 of the electronic component 14a.

The coplanar surface composed of the dielectric layer 13 and the back surface 142 may be in contact with the RDL 17.

In some embodiments, the dielectric layer 13 may include an inorganic material, such as silicon, a glass, a ceramic, a silicon oxide ($SiO_x$), a silicon nitride ($SiN_x$), a tantalum oxide ($TaO_x$) or the like. The dielectric layer 13 may include any number of layers due to design specifications.

The electronic component 14b may be disposed adjacent to the electronic component 14a. Similar to the electronic component 14a, the electronic component 14b may be a chip or a die including a semiconductor substrate, one or more integrated circuit devices and one or more overlying interconnection structures therein.

The electronic component 14b may have an active surface 141, a back surface 142 (also referred to as backside) opposite to the active surface 141 and a lateral surface 143 extending between (or connected between) the active surface 141 and the back surface 142.

The electronic component 14b may be the same or similar to the electronic component 14a. The electronic component 14b may be different from the electronic component 14a. For example, as shown in FIG. 1, a portion of the dielectric layer 13 (such as a portion of the dielectric layer 13b) is disposed between the active surface 141 of the electronic component 14b and the RDL 11. The dielectric layer 13 may cover or encapsulate the dielectric layer 14d on the active surface 141 of the electronic component 14b. The dielectric layer 13 may surround the electrical contact 14c on the active surface 141 of the electronic component 14b.

In some embodiments, the height of the electronic component 14a or the height of the electronic component 14b measured from the back surface 142 to the active surface 141 may range from about 10 μm to about 100 μm. In some embodiments, there may be any number of electronic components in the semiconductor device package 1 due to design specifications.

The insulating structure 12, or a reinforcement structure referred herein, may be disposed adjacent to the electronic component 14a and/or the electronic component 14b. The insulating structure 12 may be disposed adjacent to the dielectric layer 13. The insulating structure 12 may be in contact with the dielectric layer 13.

The insulating structure 12 may be disposed between the RDL 11 and the RDL 17.

The insulating structure 12 may have a surface 121 and a surface 122 opposite the surface 121. The surface 121 may be in contact with the RDL 11. The surface 122 may be in contact with the RDL 17. On the surface 122, an interface 12i between the insulating structure 12 and the RDL 17 may be observed.

The insulating structure 12 may have a surface (such as the surface 122 and/or the interface 12i) substantially coplanar with the back surface 142 of the electronic component 14a. The insulating structure 12 may have a surface (such as the surface 122 and/or the interface 12i) substantially coplanar with the back surface 142 of the electronic component 14b.

The insulating structure 12 may be disposed between the electronic component 14a and the electronic component 14b, while both of the electronic component 14a and the electronic component 14b are surrounded by the dielectric layer 13.

For example, the portion of the dielectric layer 13 that surrounds the electronic component 14a may be isolated from the portion of the dielectric layer 13 that surrounds the electronic component 14b by the insulating structure 12.

For example, a portion of the dielectric layer 13 may be disposed between the electronic component 14a and the insulating structure 12. For example, the dielectric layer 13 may have a surface (or a sidewall) in contact with the electronic component 14a, and an opposing surface (or an opposing sidewall) in contact with the insulating structure 12.

For example, a portion of the dielectric layer 13 is disposed between the electronic component 14b and the insulating structure 12. For example, the dielectric layer 13 may have a surface (or a sidewall) in contact with the electronic component 14b, and an opposing surface (or an opposing sidewall) in contact with the insulating structure 12.

The insulating structure 12 may include, for example, one or more organic materials, such as a molding compound, bismaleimide triazine (BT), a polyimide (PI), a polyamide (PA), a polybenzoxazole (PBO), a solder resist, an Ajinomoto build-up film (ABF), a polypropylene (PP), an epoxy-based material, a B-stage organic, or a combination of two or more thereof.

The conductive via 15 may be disposed in the insulating structure 12. The conductive via 15 may be surrounded by the insulating structure 12. The conductive via 15 may be in direct contact with the insulating structure 12.

The conductive via 15 may include, for example, Au, Ag, Cu, Ni, Pd, another metal, a solder alloy, or a combination of two or more thereof.

The seed layer 16 may be disposed between the conductive via 15 and the insulating structure 12. The seed layer 16 may include, for example, titanium (Ti), Cu, Ni, another metal, or an alloy (such as a titanium-tungsten alloy (TiW)).

The passivation layer 18 may be disposed on a surface of the RDL 17 facing away from the electronic component 14a and the electronic component 14b. The passivation layer 18 may cover the top surface of the conductive via 15 and expose another portion of the top surface of the conductive via 15. In some embodiments, the passivation layer 18 may include, for example, silicon oxide, silicon nitride, gallium oxide, aluminum oxide, scandium oxide, zirconium oxide, lanthanum oxide or hafnium oxide.

A conductive layer 20c (e.g., an under bump metallurgy layer (UBM layer)) is disposed on the top surface of the passivation layer 18 and extends into the cavity of the passivation layer 18, and is electrically connected to the exposed portion of the conductive via 15.

The electrical contact 20 (e.g. a solder ball) is disposed on the conductive layer 20c and can provide electrical connections between the semiconductor package device 1 and external components (e.g. external circuits or circuit boards). In some embodiments, the electrical contact 20 includes a controlled collapse chip connection (C4) bump, a ball grid array (BGA) or a land grid array (LGA).

Although FIG. 1 illustrates one passivation layer 18, one layer of the conductive layer 20c, and four electrical contacts 20 in the semiconductor device package 1, it is contemplated that the semiconductor device package 1 may include more or fewer passivation layers 18, more or fewer conductive layers 20c, and more or fewer electrical contacts 20.

Figure 2B:
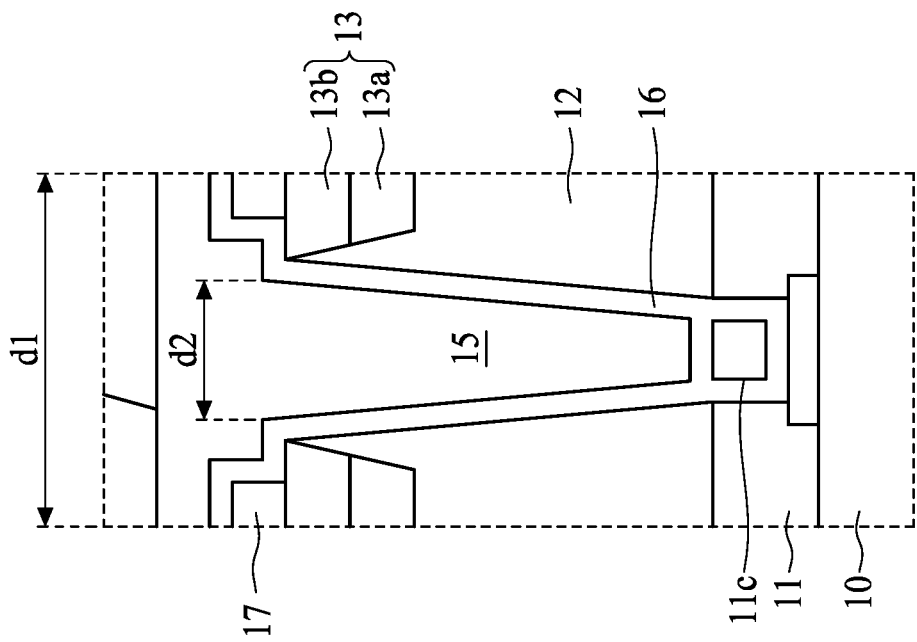
FIG. 2B illustrates an enlarged view of a portion of the semiconductor device package in accordance with some embodiments of the present disclosure.
Figure 2A:
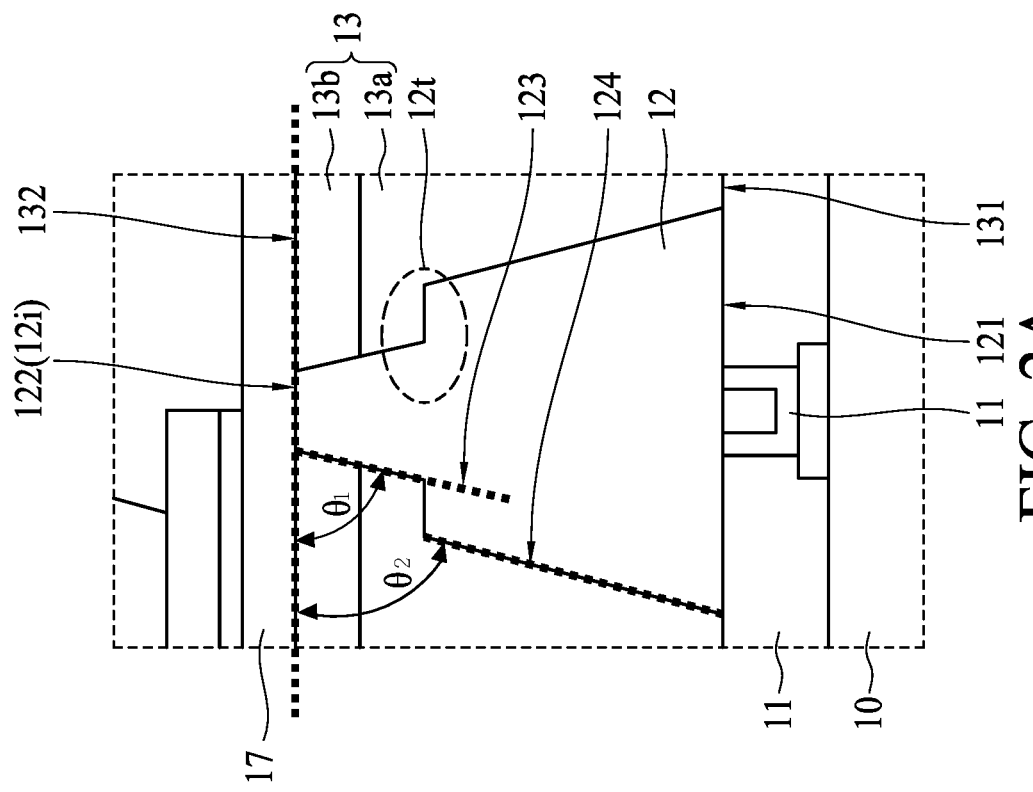
FIG. 2A illustrates an enlarged view of a portion of the semiconductor device package in accordance with some embodiments of the present disclosure.

FIG. 2A illustrates an enlarged view of a portion of the semiconductor device package in accordance with some embodiments of the present disclosure.

For example, FIG. 2A illustrates a portion of the semiconductor device package 1 in the dotted box A as illustrated in FIG. 1.

Referring to FIG. 2A, as mentioned, the dielectric layer 13 has a surface in contact with the insulating structure 12. The surface may have a portion 123, a portion 124, and a portion extending between the portion 123 and the portion 124.

The portion 123 may be closer to the RDL 17 in comparison with the portion 124. The portion 123 may be proximal to the RDL 17 in comparison with the portion 124.

On the other hand, the portion 124 may be closer to the RDL 11 in comparison with the portion 123. The portion 124 may be distal to the RDL 11 in comparison with the portion 123.

The portion 123 and the portion 124 may define a stepped feature 12t. The stepped feature 12t may be in contact with the insulating structure 12. The stepped feature 12t may be covered or encapsulated by the insulating structure 12.

The portion 123 may form an angle $\theta_1$ with a surface of the RDL 17. The portion 124 may form an angle $\theta_2$ with a surface of the RDL 17.

In some embodiments, the angle $\theta_1$ may be different from the angle $\theta_2$. For example, the angle $\theta_1$ may be smaller than the angle $\theta_2$. For example, the angle $\theta_1$ may be bigger than the angle $\theta_2$. In some embodiments, the angle $\theta_1$ may be substantially the same as the angle $\theta_2$.

In some embodiments, the angle $\theta_1$ may between about 60° and about 80°.

A portion of the insulating structure 12 in contact with the portion 123 may have a width different from that of a portion of the insulating structure 12 in contact with the portion 124. For example, the portion (or a narrower portion) of the insulating structure 12 in contact with the portion 123 may have a smaller width from a side view perspective. For example, the portion (or a wider portion) of the insulating structure 12 in contact with the portion 124 may have a bigger width from a side view perspective. For example, the portion (or a narrower portion) of the insulating structure 12 in contact with the portion 123 may have a smaller diameter from a top view perspective. For example, the portion (or a wider portion) of the insulating structure 12 in contact with the portion 124 may have a bigger diameter from a top view perspective.

FIG. 2B illustrates an enlarged view of a portion of the semiconductor device package in accordance with some embodiments of the present disclosure.

For example, FIG. 2B illustrates a portion of the semiconductor device package 1 in the dotted box B as illustrated in FIG. 1.

Referring to FIG. 2B, the conductive via 15 may penetrate the insulating structure 12. The conductive via 15 may penetrate the portion (or a narrower portion) of the insulating structure 12 in contact with the portion 123. The conductive via 15 may penetrate the portion (or a wider portion) of the insulating structure 12 in contact with the portion 124.

The stepped feature 12t defined by the portion 123 and the portion 124 may surround the conductive via 15.

From a side view perspective, the conductive via 15 may have a tapered sidewall. For example, the conductive via 15 may have a portion disposed on the dielectric layer 13 and a portion disposed within the dielectric layer 13 (and also within the insulating structure 12). The portion disposed on the dielectric layer 13 may have a diameter d1. The portion disposed within the dielectric layer 13 may have a diameter d2.

In some embodiments, the diameter d2 may gradually shrink toward the RDL 11.

In some embodiments, the diameter d1 may range from about 12 μm to about 18 μm, such as about 15 μm. In some embodiments, the diameter d2 may range from about 9 μm to about 11 μm, such as about 10 μm.

Figure 2D:
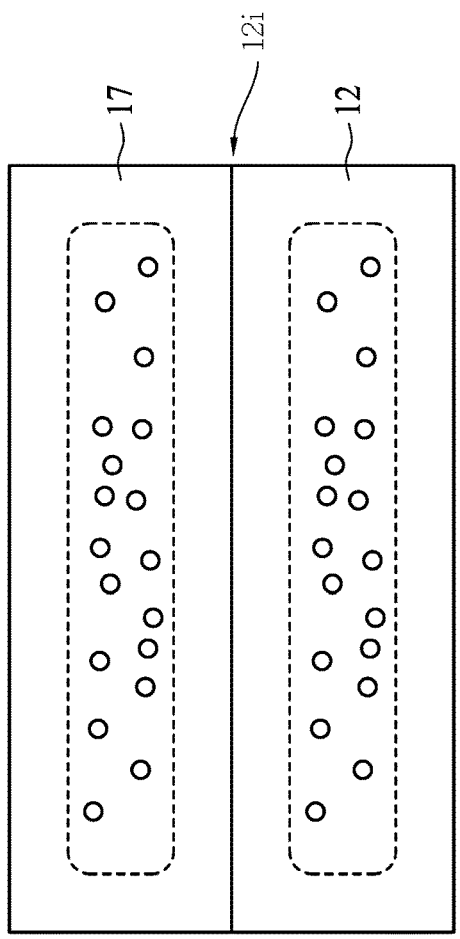
FIG. 2D illustrates an enlarged view of a portion of the semiconductor device package in accordance with some embodiments of the present disclosure.
Figure 2C:
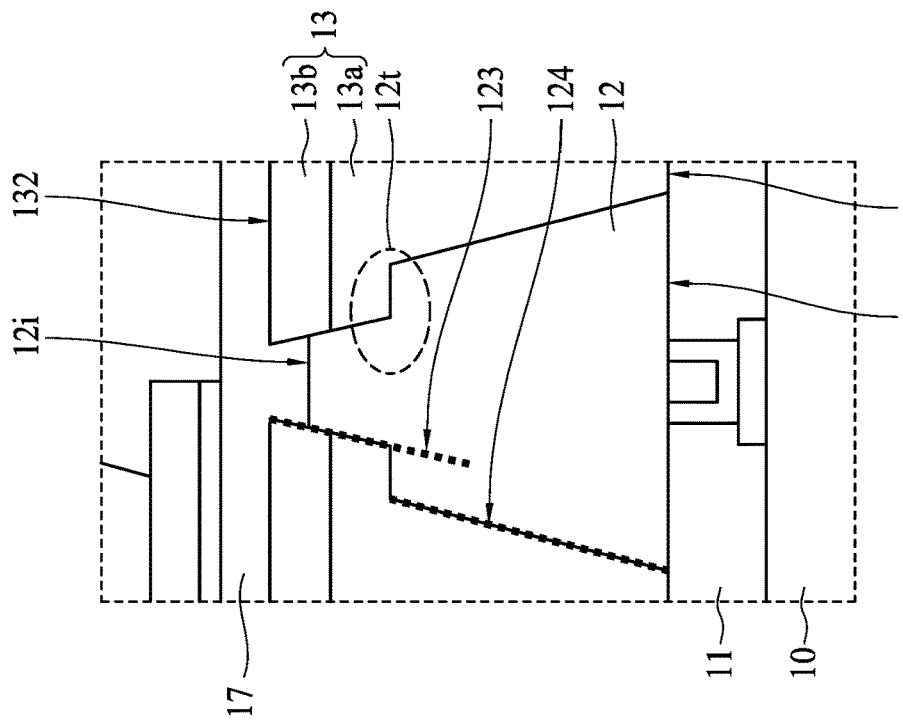
FIG. 2C illustrates an enlarged view of a portion of the semiconductor device package in accordance with some embodiments of the present disclosure.

FIG. 2C illustrates an enlarged view of a portion of the semiconductor device package in accordance with some embodiments of the present disclosure.

For example, FIG. 2C illustrates a portion of the semiconductor device package 1 in the dotted box A as illustrated in FIG. 1.

The structure in FIG. 2C is similar to the structure in FIG. 2A, and the differences therebetween are described below.

The interface 12i, as illustrated in FIG. 2C, between the insulating structure 12 and the RDL 17 may be spaced apart from the surface 132 of the dielectric layer 13. As mentioned, the surface 132 of the dielectric layer 13 may be coplanar with the back surface 142 of the electronic component 14a as illustrated in FIG. 1. Therefore, the interface 12i may be spaced apart from the back surface 142 of the electronic component 14a.

For example, the interface 12i may be under the surface 132 of the dielectric layer 13. For example, the interface 12i may be not coplanar with the surface 132 of the dielectric layer 13.

Referring to FIG. 2D, in some embodiments, the insulating structure 12 and the RDL 17 may include epoxy resin including fillers dispersed therein. The distribution of the fillers thereof can differentiate between of the insulating structure 12 and the RDL 17. For example, the interface 12i may be identified as a portion exclusive of fillers, or having fewer fillers dispersed than other portions. For example, as illustrated in FIG. 2D, the interface 12i may be identified between the insulating structure 12 and the RDL 17 where the fillers dispersed are fewer than the portions distal from the interface 12i.

Figure 3:
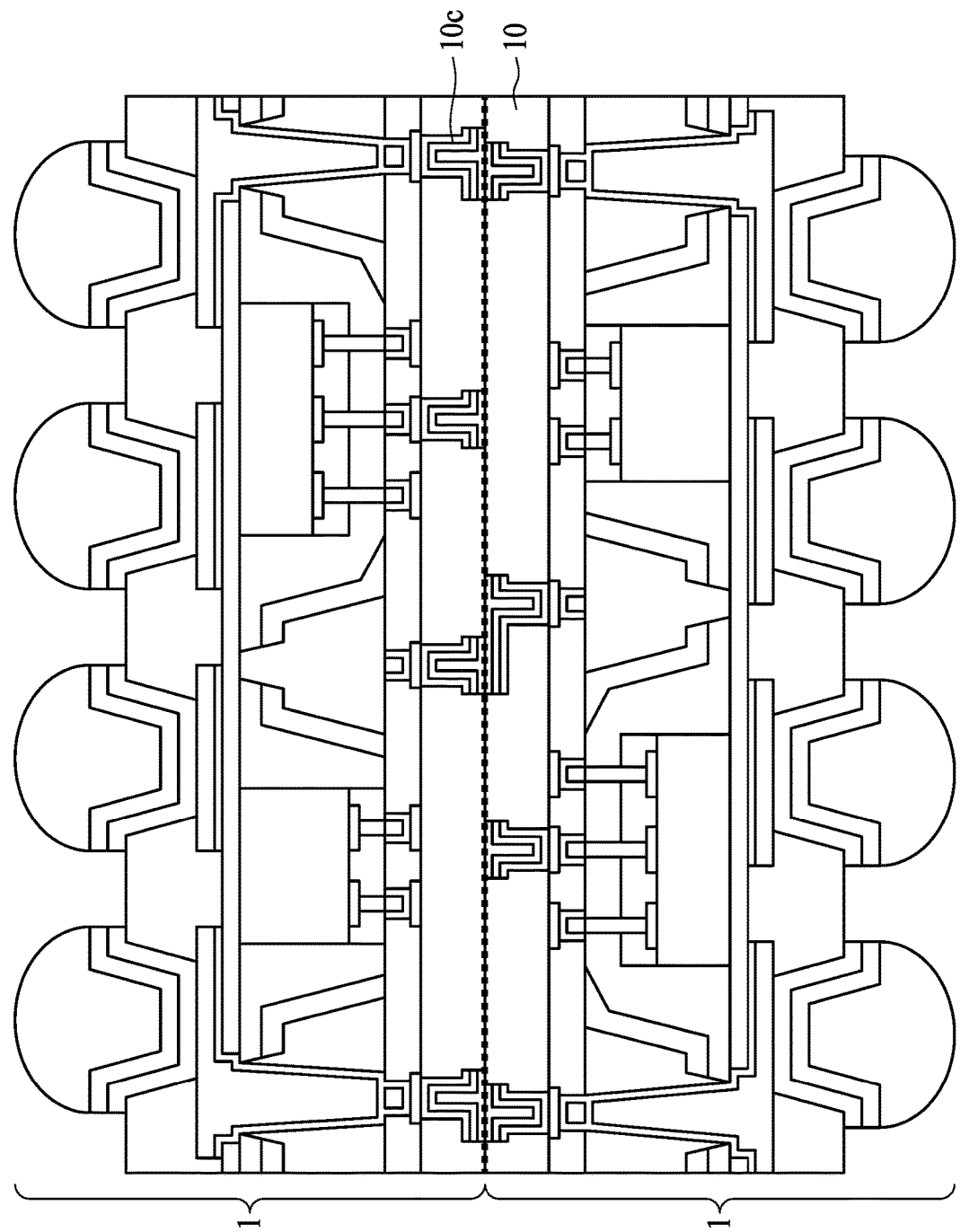
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure.

The semiconductor device package 3 may include a semiconductor device package 1 (which may be similar or identical to the semiconductor device package 1 as illustrated in FIG. 1) attached or bonded to another semiconductor device package 1 through a substrate 10. The substrate 10 may be similar or identical to the substrate 10 described above with respect to FIG. 1, except that there may be conductive element 10c in the substrate 10 in FIG. 3. The conductive element 10c may be an interconnection structure, such as RDL, a grounding element, a through-silicon via (TSV), or the likes. The semiconductor device packages 1 may be electrically connected through the conductive element 10c.

Figure 4:
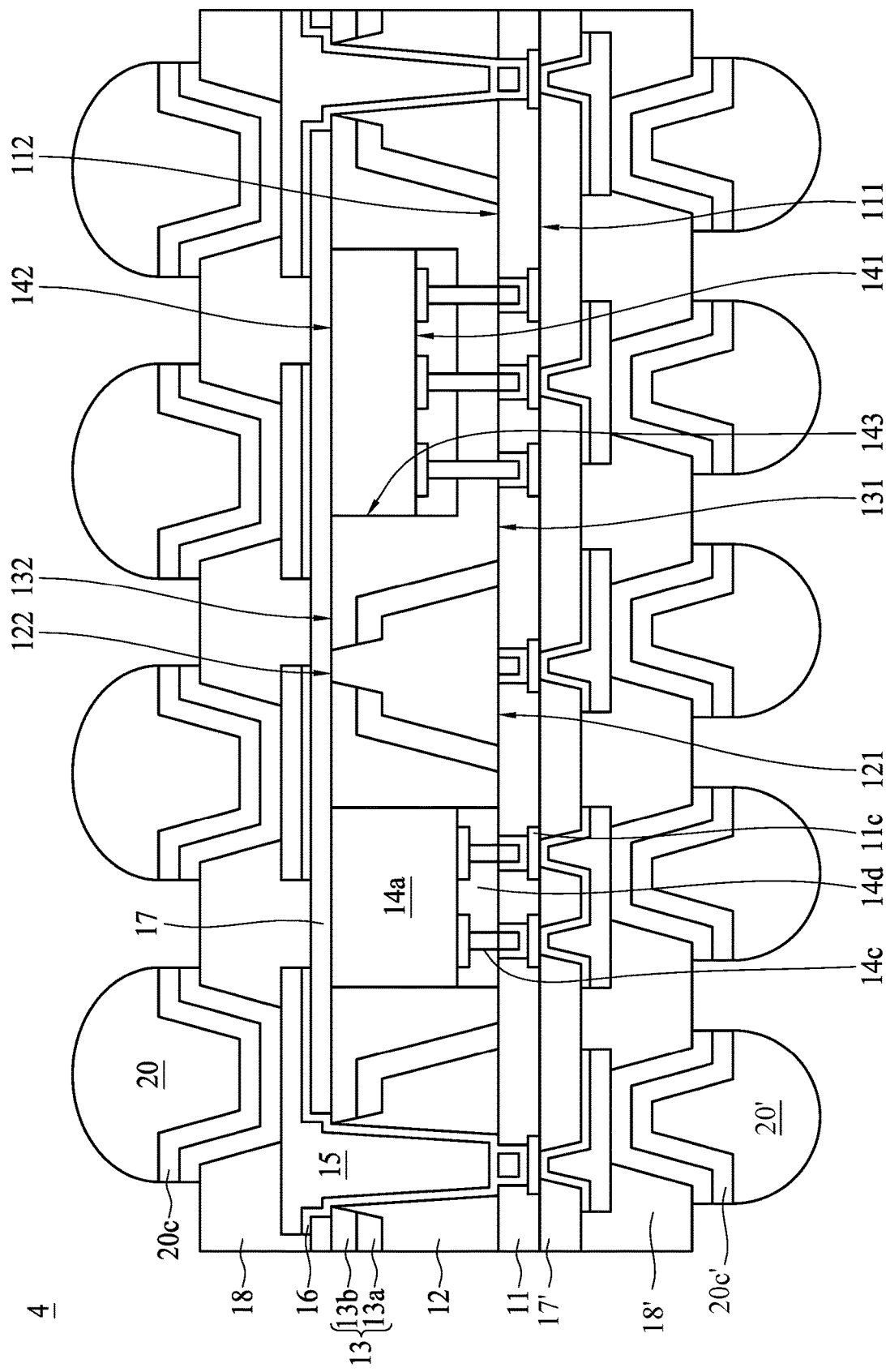
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure.

The semiconductor device package 4 in FIG. 4 is similar to the semiconductor device package 1 in FIG. 1, and the differences therebetween are described below.

The substrate 10 as illustrated in FIG. 1 may be replaced with an RDL 17', a passivation layer 18', and an electrical contact 20'.

The RDL 17', the passivation layer 18', and the electrical contact 20' may be similar or identical to the RDL 17, the passivation layer 18, and the electrical contact 20, respectively.

In some embodiments, the electrical contact 20' as illustrated in FIG. 4 may be replaced with a metal pillar (e.g., a Cu pillar) of any shape, such as square, circle, or rectangle.

Figure 5:
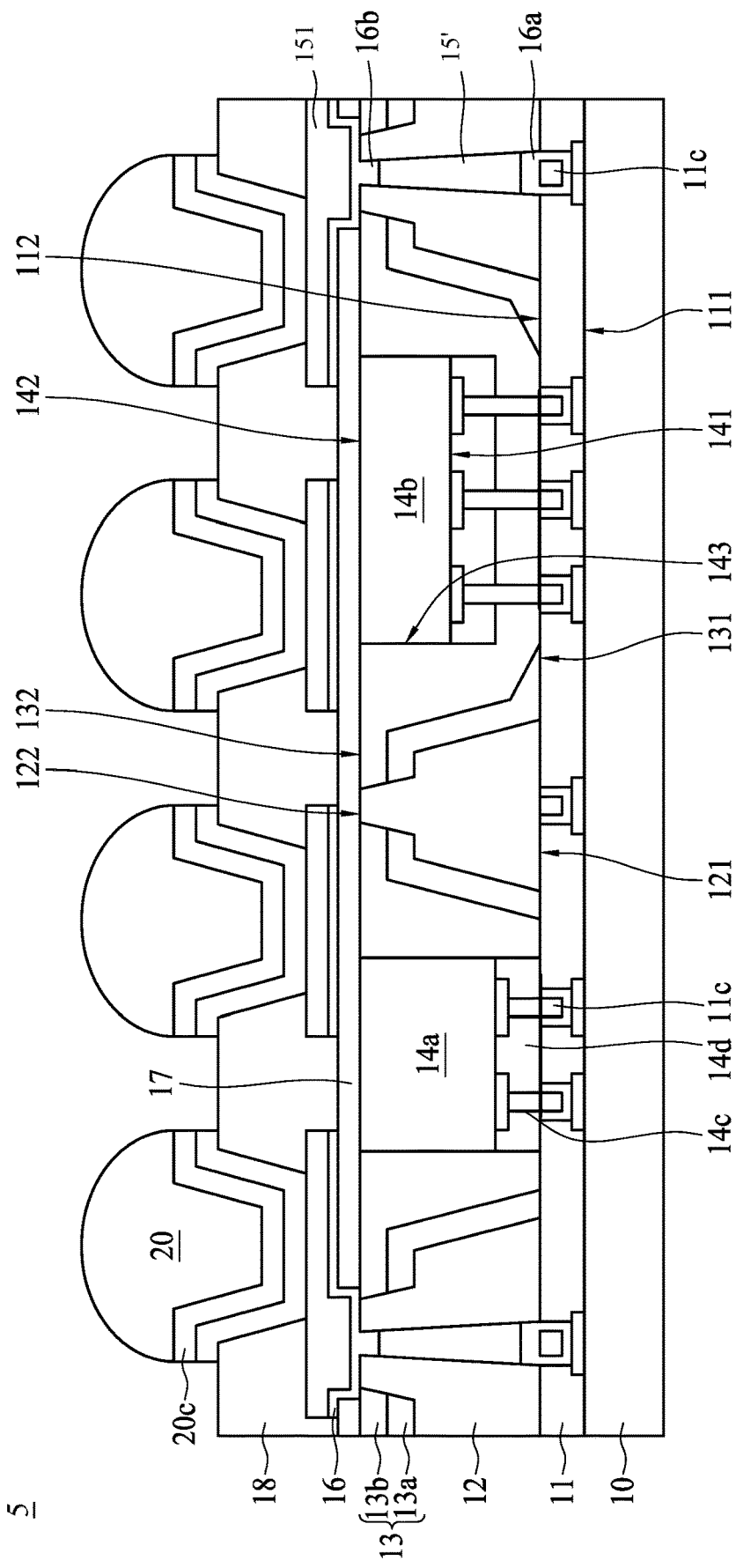
FIG. 5 illustrates a cross-sectional view of a semiconductor device package in accordance with some embodiments of the present disclosure.

FIG. 5 illustrates a cross-sectional view of a semiconductor device package 5 in accordance with some embodiments of the present disclosure.

The semiconductor device package 5 in FIG. 5 is similar to the semiconductor device package 1 in FIG. 1, and the differences therebetween are described below.

The seed layer 16 as illustrated in FIG. 1 may be replaced with seed layers 16a and 16b as illustrated in FIG. 5. The conductive via 15 as illustrated in FIG. 1 may be replaced with conductive via 15' as illustrated in FIG. 5.

The seed layer 16a may be disposed between the conductive via 15' and the conductive structure 11c in the RDL 11. The seed layer 16b may be disposed between the conductive via 15' and a conductive layer 151 disposed on the RDL 17.

The conductive via 15' may be tapered toward the RDL 17.

FIG. 6A, FIG. 6B, FIG. 6C, FIG. 6D, FIG. 6E, FIG. 6F, FIG. 6G, FIG. 6H, FIG. 6I, FIG. 6J, and FIG. 6K are cross-sectional views of a semiconductor device package at various stages of fabrication, in accordance with some embodiments of the present disclosure. At least some of these figures have been simplified for a better understanding of the aspects of the present disclosure.

Figure 6A:
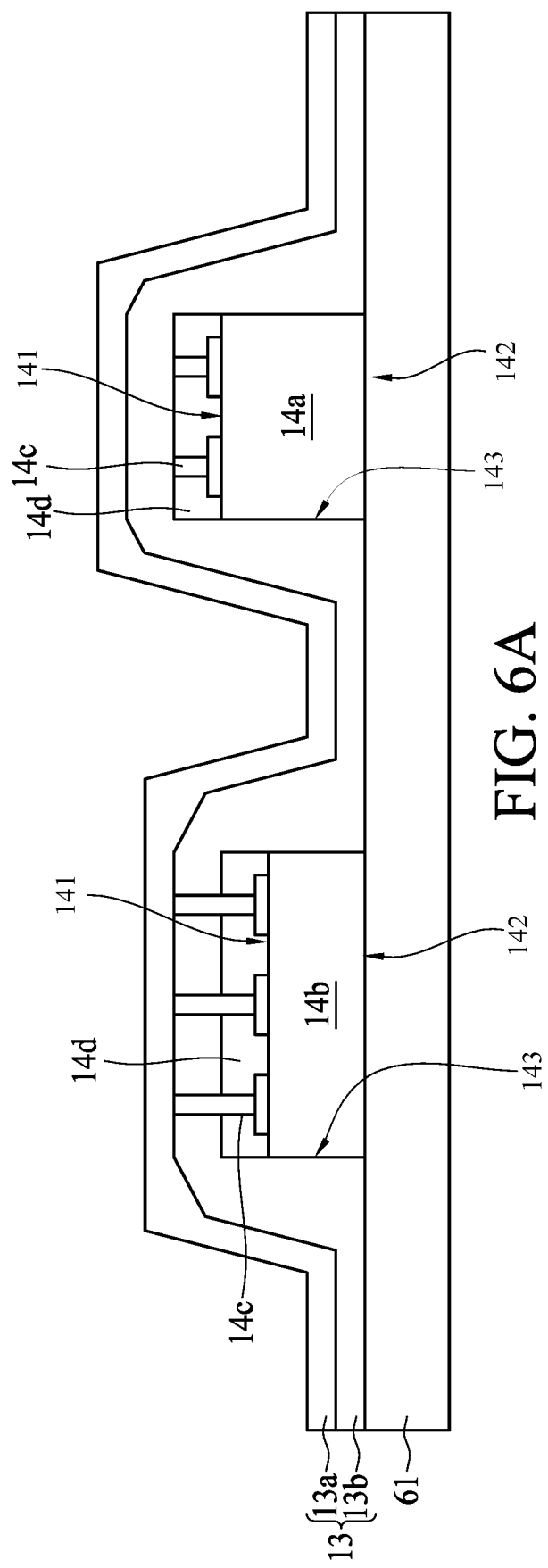
FIG. 6A, FIG. 6B, FIG. 6C, FIG. 6D, FIG. 6E, FIG. 6F, FIG. 6G, FIG. 6H, FIG. 6I, FIG. 6J, and FIG. 6K illustrate various intermediate stages of a method for manufacturing a semiconductor device package in a cross-sectional perspective, in accordance with some embodiments of the present disclosure.

Referring to FIG. 6A, an electronic component 14a and another electronic component 14b may be disposed on a temporary carrier 61. Each of the electronic components 14a and 14b may have an active surface 141, a back surface 142 (also referred to as backside) opposite to the active surface 141 and a lateral surface 143 extending between (or connected between) the active surface 141 and the back surface 142.

An electrical contact 14c may be disposed on the active surfaces 141 of the electronic component 14a and the electronic component 14b. A dielectric layer 14d may be disposed on the active surfaces 141 of the electronic component 14a and the electronic component 14b to surround the electrical contact 14c.

A dielectric layer 13 (including a dielectric layer 13a and a dielectric layer 13b) may be disposed on the temporary carrier 61 to surround the electronic component 14a and the electronic component 14b.

The dielectric layer 13 may cover or encapsulate the electronic component 14a and the electronic component 14b.

The dielectric layer 13 may cover or encapsulate an electrical contact 14c on the electronic component 14a. The dielectric layer 13 may cover or encapsulate an electrical contact 14c on the electronic component 14b.

In some embodiments, the dielectric layer 13 may be formed by, for example, coating, lamination or other suitable processes.

Figure 6B:
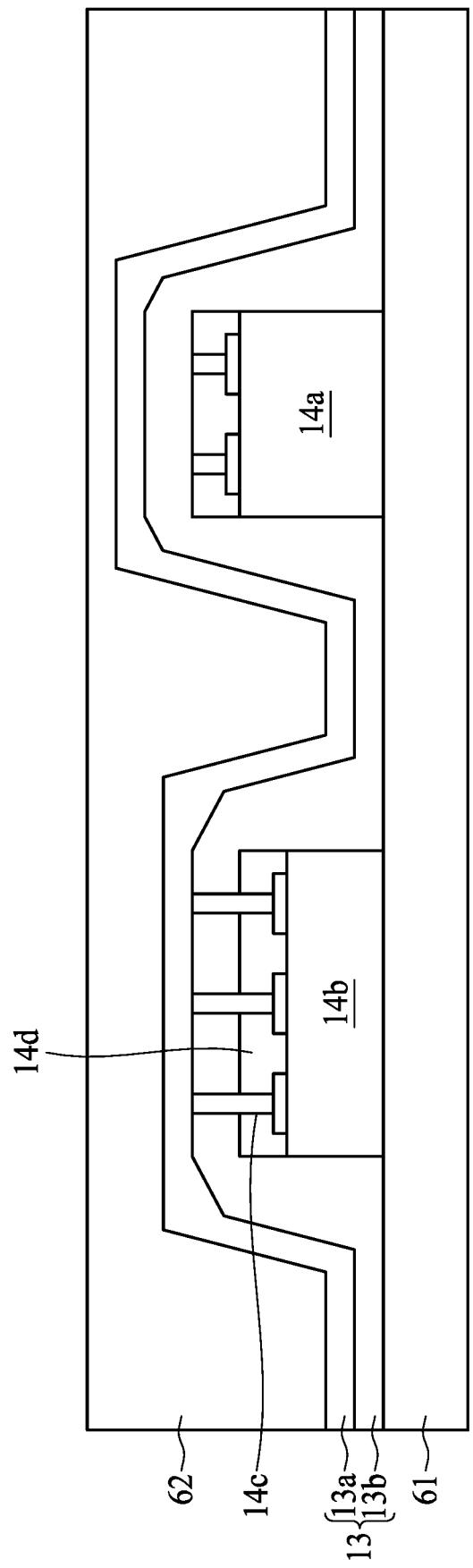

Referring to FIG. 6B, a photoresist film (or a mask) 62 may be formed on the dielectric layer 13.

Figure 6C:
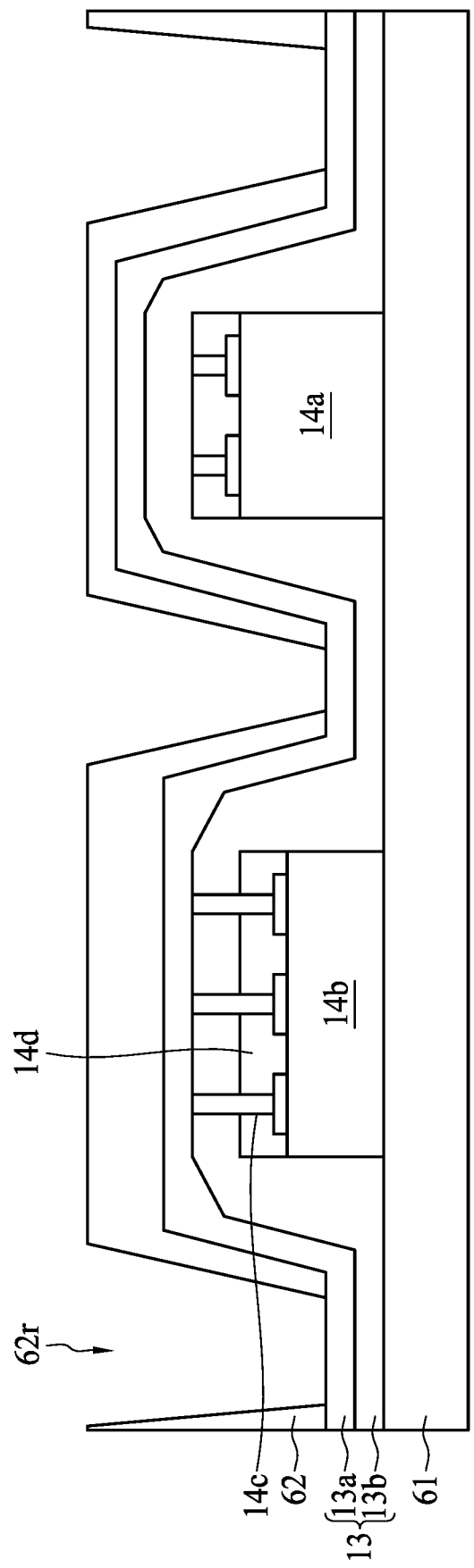

Referring to FIG. 6C, the mask 62 may be partially removed (or be patterned) to form a recess 62r and a portion of the dielectric layer 13 may expose through the recess 62r.

Figure 6D:
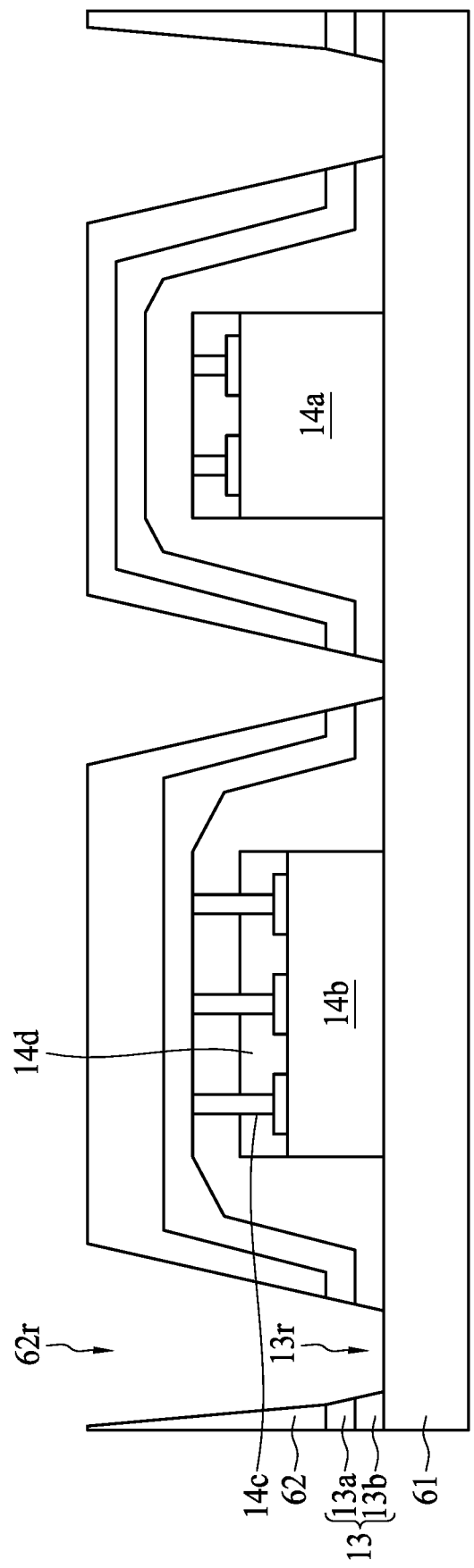

Referring to FIG. 6D, the dielectric layer 13 may be partially removed (or be patterned) through the mask 62 to form a recess 13r and a portion of the temporary carrier 61 may expose through the recess 13r.

Figure 6E:
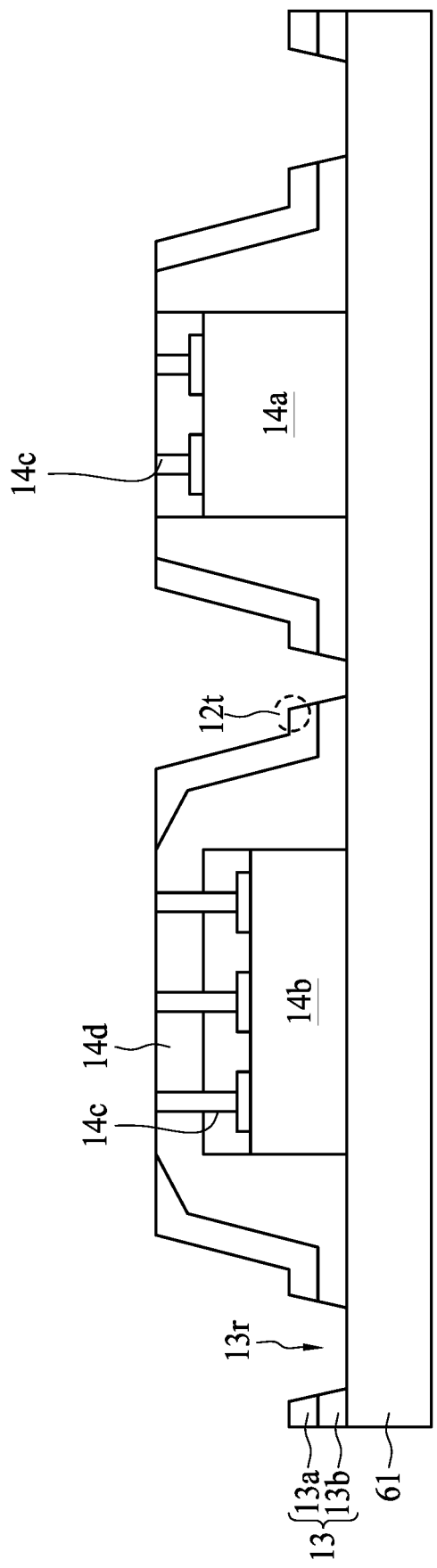

Referring to FIG. 6E, the mask 62 in FIG. 6D is removed. A stepped feature 12t may be defined on the dielectric layer 13.

A thinning operation may be conducted to expose the electrical contact 14c on the electronic component 14a and the electronic component 14b. The electronic component 14a may be exposed from the dielectric layer 13. The electronic component 14a may be exposed from the dielectric layer 14d.

The electrical contact 14c and the dielectric layer 13 over the electronic component 14b may form a hybrid surface of the electronic component 14b. The electrical contact 14c and the dielectric layer 14d over the electronic component 14a may form a hybrid surface of the electronic component 14a.

Figure 6F:
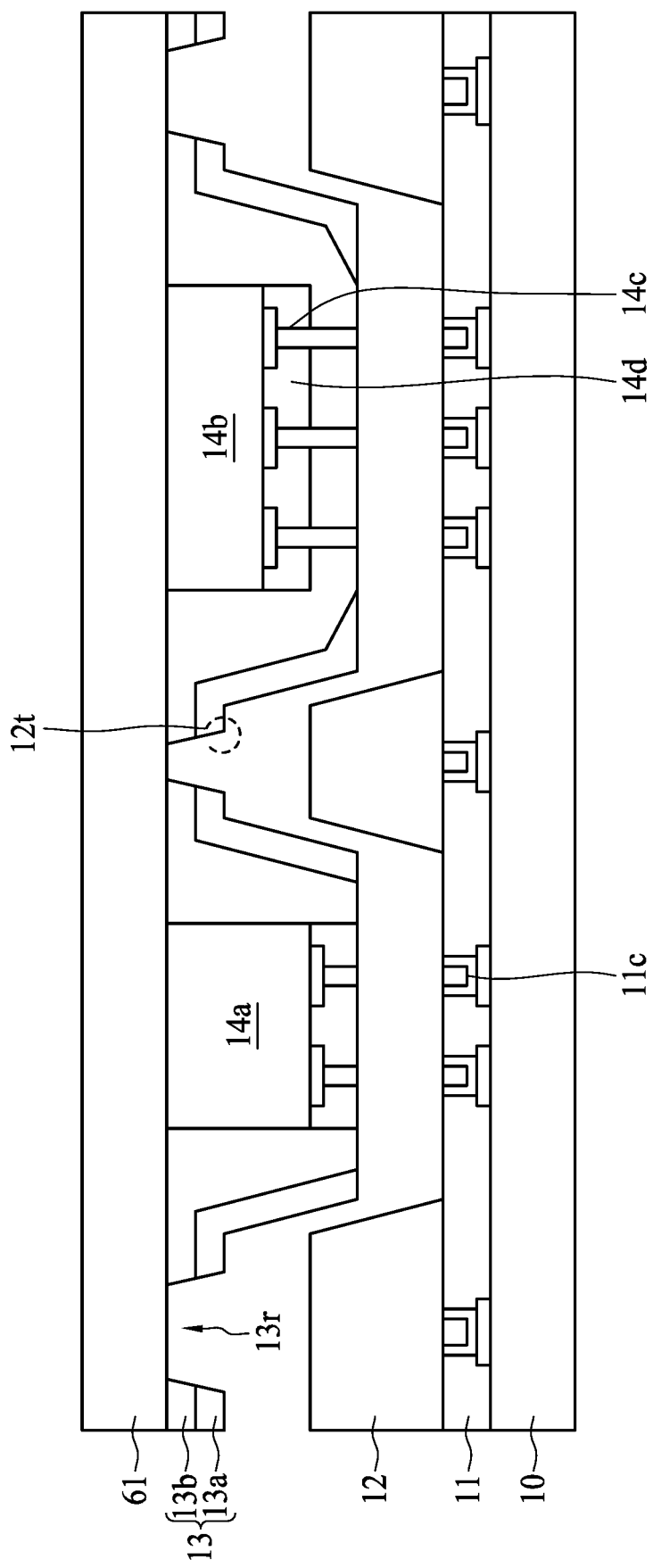

Referring to FIG. 6F, the structure obtained from FIG. 6E may be reversed upside down. An insulating structure 12 may be disposed on the temporary carrier 61 by combining the insulating structure 12, along with an RDL 11 and a substrate 10, to the temporary carrier 61.

The insulating structure 12 may be disposed on a hybrid surface of the RDL 11 provided on the substrate 10. The RDL 11 may include a conductive structure 11c and a dielectric layer. The conductive structure 11c and the dielectric layer of the RDL 11 may form the hybrid surface of the RDL 11.

In some embodiments, the insulating structure 12 may be provided on the hybrid surface of the RDL 11 through, for example, a release tape.

The insulating structure 12 may be disposed on the temporary carrier 61 while the hybrid surface of the RDL 11 is attached or bonded with the hybrid surface of the electronic component 14a and/or the hybrid surface of the electronic component 14b.

For example, disposing the insulating structure 12 on the temporary carrier 61 may be conducted concurrently with bonding the hybrid surface of the electronic component 14a and/or hybrid surface of the electronic component 14b to the hybrid surface of the RDL 11.

During the bonding process of the hybrid surfaces, temperature and/or pressure may be adjusted. In some embodiments, the insulating structure 12 may be deformed due to the temperature and/or pressure adjustment. In some embodiments, the insulating structure 12 may be deformed to cover or encapsulate the stepped feature 12t. In some embodiments, the insulating structure 12 may be deformed to flow into the recess 13r.

Figure 6G:
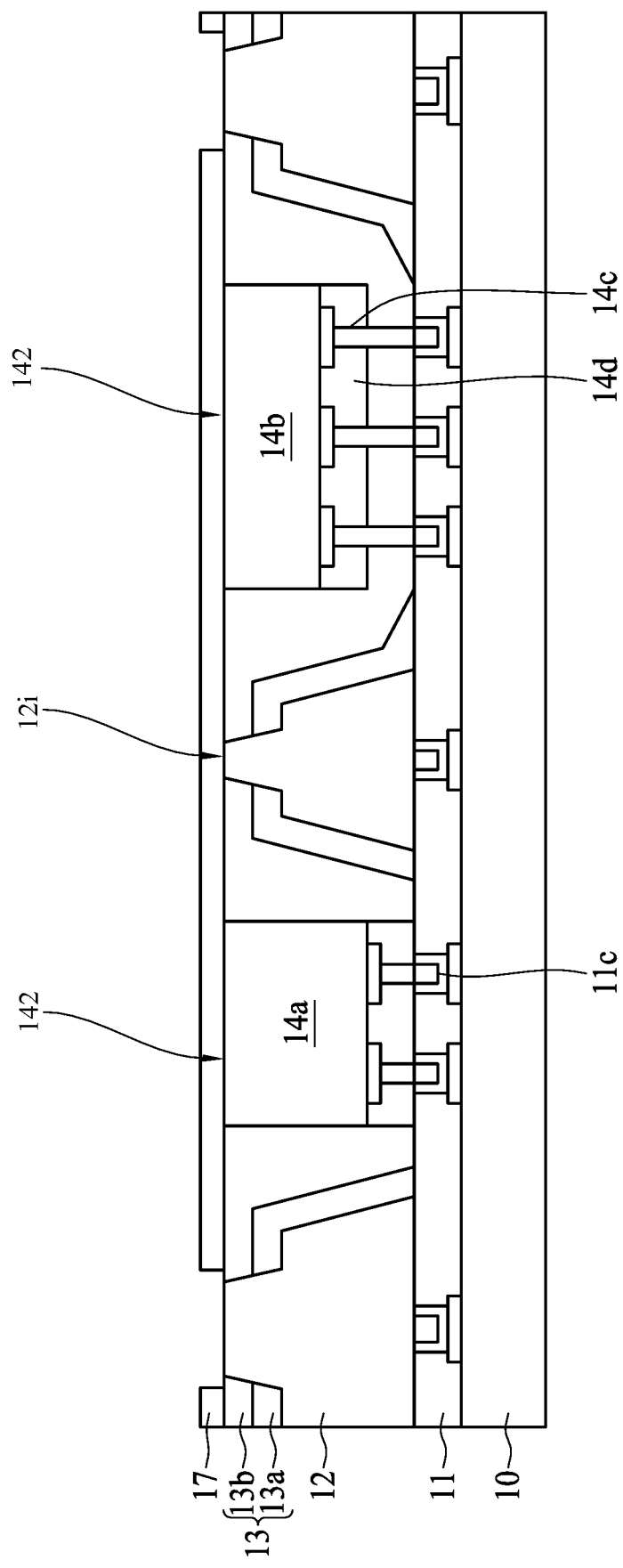

Referring to FIG. 6G, the temporary carrier 61 in FIG. 6F may be removed.

An RDL 17 may be provided on the back surfaces 142 of the electronic component 14a and the electronic component 14b.

The RDL 17 may be provided on the insulating structure 12 in the recess 13r as illustrated in FIG. 6E. In some embodiments, an interface 12i between the insulating structure 12 and the RDL 17 may be observed.

In some embodiments, the interface 12i may be substantially coplanar with the back surfaces 142 of the electronic component 14a and/or the electronic component 14b. In some embodiments, the interface 12i may be under the back surfaces 142 of the electronic component 14a and/or the electronic component 14b.

After the RDL 17 is provided, the RDL 17 may be patterned to expose a portion of the insulating structure 12.

Figure 6H:
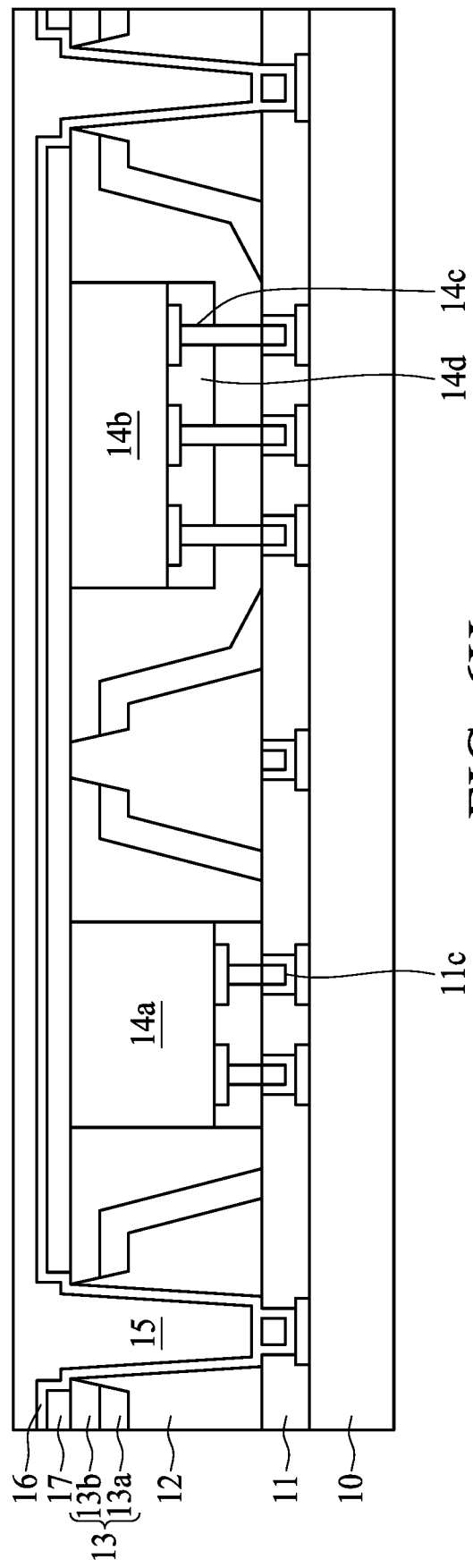

Referring to FIG. 6H, the exposed insulating structure 12 in FIG. 6G may be removed to expose conductive structures in the RDL 11.

A seed layer 16 may be disposed on the exposed surfaces of the RDL 11. The seed layer 16 may be disposed on the insulating structure 12. The seed layer 16 may be disposed on the RDL 17. The seed layer 16 may be formed by sputtering titanium and copper (Ti/Cu) or a titanium-tungsten alloy (TiW). In some embodiments, the seed layer 16 may be formed by electroless plating Ni or Cu.

A conductive material may be disposed on the seed layer 16 to form a conductive via 15. In some embodiments, the conductive material may be formed by plating Cu, Ag, Ni, Au, or another metal. In some embodiments, the conductive material may be formed by electroless plating Cu, Ni, Pb, or another metal. In some embodiments, the conductive material may be formed by printing Cu, Ag, Au, or another metal.

Figure 6I:
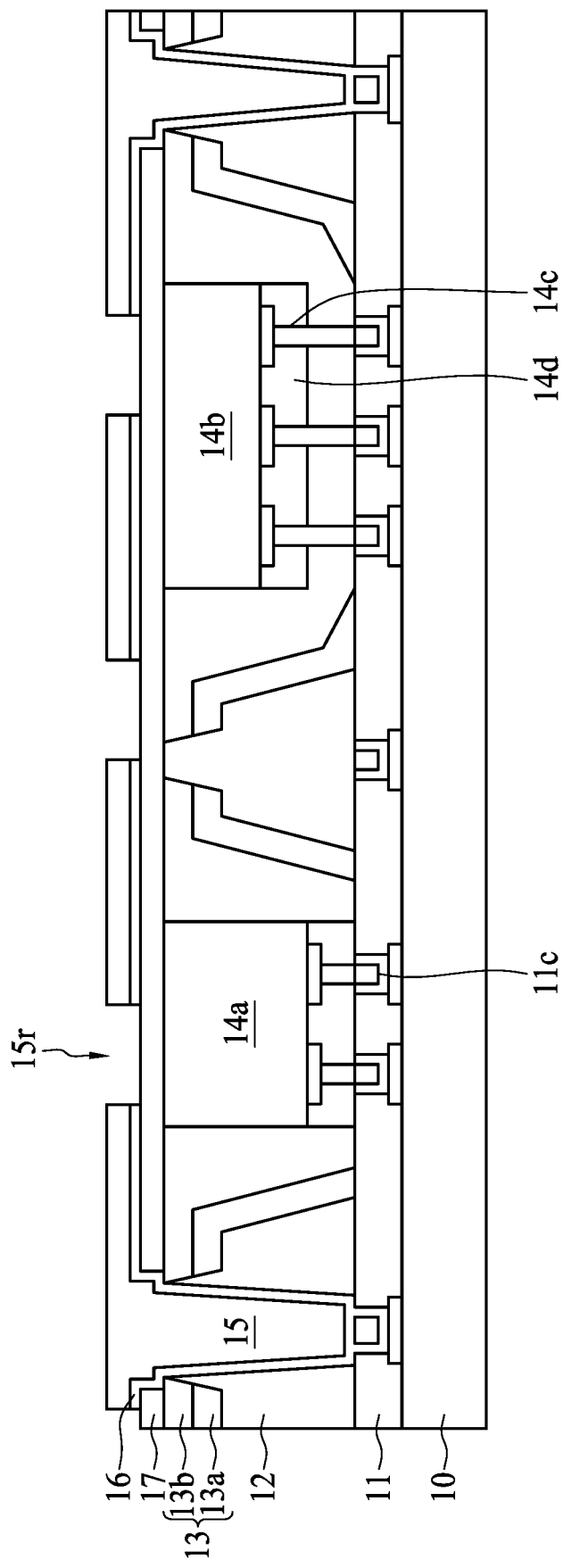

Referring to FIG. 6I, the conductive material may be patterned to form an opening or a recess 15r exposing a portion of the RDL 17. For example, a photoresist film (or a mask) is formed on the conductive material by, for example, coating. One or more openings are formed in the photoresist film by, for example, lithographic technique, to expose a portion of the conductive material. The conductive material is patterned through the openings in the photoresist film.

Figure 6J:
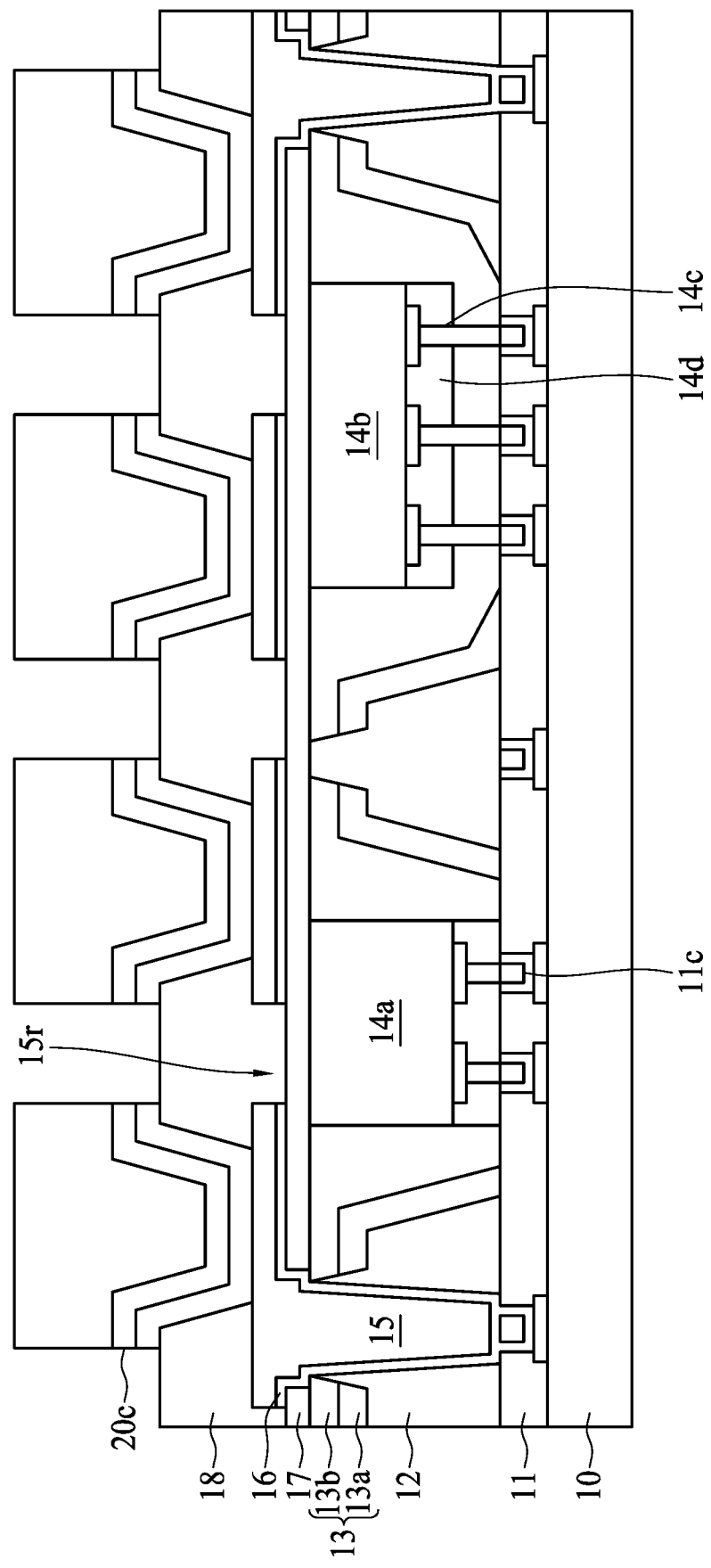

Referring to FIG. 6J, a passivation layer 18 may be disposed to cover the conductive material in FIG. 6I. The passivation layer 18 may be patterned, and a conductive material may be disposed and patterned on the passivation layer 18 to form the conductive layer 20c. In some embodiments, before disposing the conductive material, a seed layer may be disposed on the passivation layer 18. A soldering layer may be disposed on the conductive layer 20c.

Figure 6K:
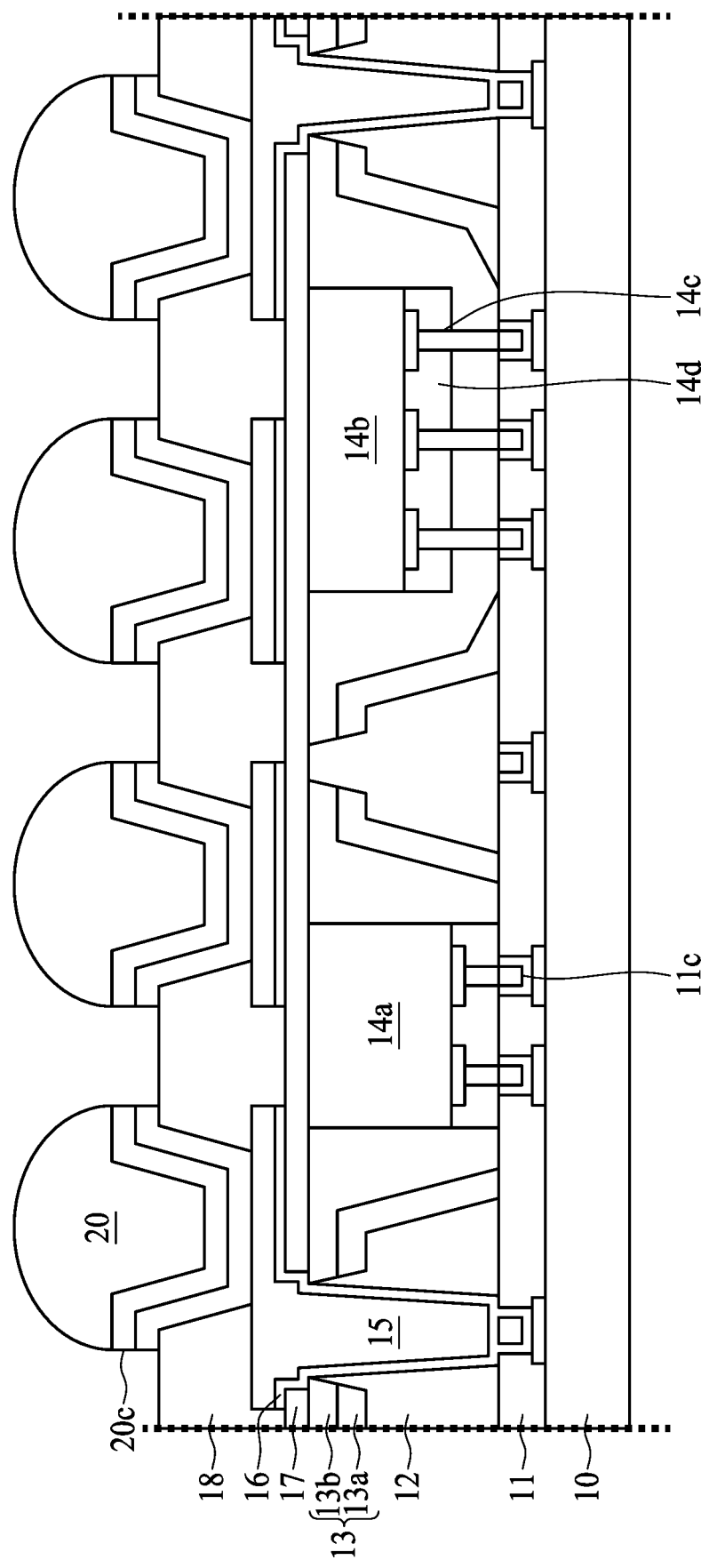

Referring to FIG. 6K, one or more electrical contacts 20 may be provided the conductive layer 20c through the soldering layer as illustrated in FIG. 6J.

A singulation operation (e.g., by using a dicing saw, laser, punching machine or other appropriate cutting technique) may be conducted to cut out discrete device package as illustrated in FIG. 1.

Figure 7B:
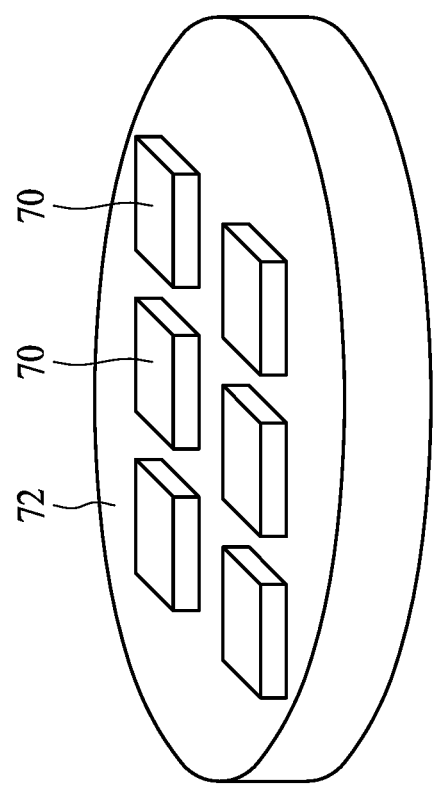
FIG. 7B illustrates examples of various types of semiconductor device packages in accordance with some embodiments of the present disclosure.
Figure 7A:
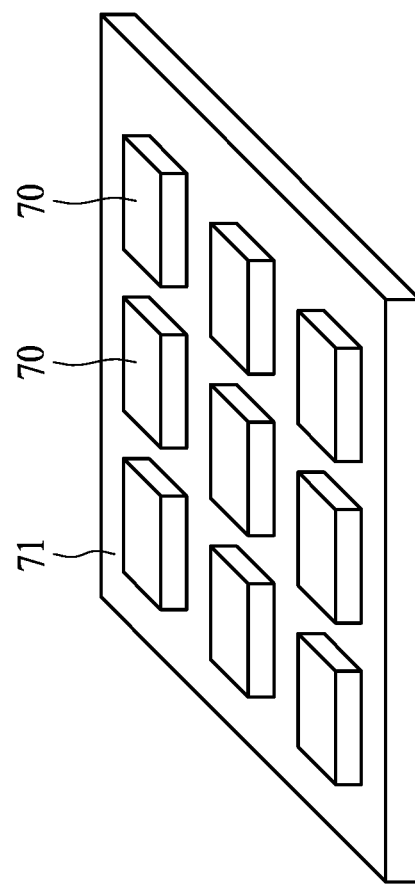
FIG. 7A illustrates examples of various types of semiconductor device packages in accordance with some embodiments of the present disclosure.

FIG. 7A and FIG. 7B illustrate examples of different types of semiconductor device packages in accordance with some embodiments of the present disclosure.

As shown in FIG. 7A, a plurality of chips 70 and/or dies are placed on a square-shaped carrier 71. In some embodiments, the chips 70 may include at least one of the semiconductor device packages 1, 3-5 as shown in FIGS. 1, 3, 4, and 5. In some embodiments, the carrier 71 may include organic materials (e.g., a molding compound, BT, a PI, a PBO, a solder resist, an ABF, a PP, an epoxy-based material, or a combination of two or more thereof) or inorganic materials (e.g., silicon, a glass, a ceramic, a quartz, or a combination of two or more thereof).

As shown in FIG. 7B, a plurality of chips 70 and/or dies are placed on a circle-shaped carrier 72. In some embodiments, the carrier 72 may include organic materials (e.g., a molding compound, BT, a PI, a PBO, a solder resist, an ABF, a PP, an epoxy-based material, or a combination of two or more thereof) or inorganic materials (e.g., silicon, a glass, a ceramic, a quartz, or a combination of two or more thereof).

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
   an electronic component having an active surface, a back surface opposite to the active surface, and a lateral surface connected between the active surface and the back surface, the electronic component having an electrical contact disposed on the active surface;
   a redistribution layer (RDL) contacting the back surface of the electronic component;
   a first dielectric layer surrounding the electrical contact on the active surface of the electronic component;
   a second dielectric layer surrounding the lateral surface of the electronic component and the first dielectric layer, wherein the second dielectric layer has a first sidewall in contact with the lateral surface of the electronic component and a second sidewall opposite the first sidewall, wherein the second sidewall of the second dielectric layer has a first portion proximal to the RDL and a second portion distal from the RDL, the first portion and the second portion defining a stepped feature on the second sidewall; and an insulating structure in contact with the stepped feature on the second sidewall of the second dielectric layer, wherein the insulating structure has a narrower portion in contact with the first portion of the second sidewall, and a wider portion in contact with the second portion of the second sidewall, and wherein the narrower portion of the insulating structure comprises a smaller diameter than the wider portion of the insulating structure from a top view perspective.

2. The semiconductor device package of claim 1, wherein the electrical contact on the active surface of the electronic component is substantially coplanar with the first dielectric layer.

3. The semiconductor device package of claim 1, wherein the insulating structure has a surface substantially coplanar with the back surface of the electronic component.

4. The semiconductor device package of claim 1, further comprising:

a conductive via penetrating the narrower portion and the wider portion of the insulating structure.

5. The semiconductor device package of claim 4, wherein the stepped feature surrounds the conductive via.

6. The semiconductor device package of claim 4, further comprising:

a seed layer disposed between the conductive via and the insulating structure.

7. The semiconductor device package of claim 4, wherein the conductive via is in direct contact with the insulating structure.

8. The semiconductor device package of claim 1, wherein the second dielectric layer includes an inorganic material and the insulating structure includes an organic material.

9. The semiconductor device package of claim 1, wherein the first portion forms a first angle with a surface of the RDL and the second portion forms a second angle with the surface of the RDL, and wherein the first angle is different from the second angle.

10. The semiconductor device package of claim 1, wherein the insulating structure has a surface in contact with the RDL.

* * * * *